(12) United States Patent
Lu

(10) Patent No.: US 11,057,044 B2
(45) Date of Patent: Jul. 6, 2021

(54) TIME-INTERLEAVED ANALOG-TO-DIGITAL CONVERTER WITH CALIBRATION

(71) Applicant: Intel Corporation, Santa Clara, CA (US)

(72) Inventor: Cho-Ying Lu, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/876,942

(22) Filed: May 18, 2020

(65) Prior Publication Data

US 2020/0280321 A1 Sep. 3, 2020

Related U.S. Application Data

(63) Continuation of application No. 16/221,394, filed on Dec. 14, 2018, now Pat. No. 10,659,072.

(51) Int. Cl.
*H03M 1/10* (2006.01)
*H03M 1/12* (2006.01)
(Continued)

(52) U.S. Cl.
CPC ....... *H03M 1/1215* (2013.01); *H03M 1/0609* (2013.01); *H03M 1/1061* (2013.01); *H03M 1/168* (2013.01)

(58) Field of Classification Search
CPC .. H03M 3/408; H03M 1/0673; H03M 1/1215; H03M 1/365; H03M 1/662; H03M 3/424; H03M 1/1014; H03M 7/30; H03M 3/438; H03M 3/464; H03M 1/56; H03M 13/1515; H03M 13/27; H03M 13/356; H03M 1/1004; H03M 1/1028; H03M 1/1205; H03M 1/502; H03M 3/338; H03M 3/458; H03M 3/502; H03M 1/0695; H03M 1/1033; H03M 1/1057; H03M 1/121; H03M 1/1245; H03M 1/167; H03M 1/183; H03M 1/361; H03M 1/804
(Continued)

(56) References Cited

U.S. PATENT DOCUMENTS 4,736,189 A 4/1988 Katsumata et al.
8,120,289 B2 * 2/2012 Vaassen ................. H05B 45/40
315/362
(Continued)

OTHER PUBLICATIONS

Non-Final Office Action from U.S. Appl. No. 16/221,394 notified Aug. 29, 2019, 8 pgs.
(Continued)

*Primary Examiner* — Linh V Nguyen
(74) *Attorney, Agent, or Firm* — Green, Howard & Mughal LLP

(57) ABSTRACT

An apparatus is provided to calibrate an analog-to-digital converter (ADC). The apparatus includes a calibration circuitry coupled to an output of the ADC, wherein the calibration circuitry is to identify a maximum value and minimum value of the output of the ADC, and is to calibrate one or more performance parameters of the ADC according to the maximum and minimum values. The performance parameters include: gain of the ADC, offset of the ADC, and timing skew between the ADC and a neighboring ADC.

20 Claims, 8 Drawing Sheets

(51) Int. Cl.
*H03M 1/16* (2006.01)
*H03M 1/06* (2006.01)

(58) Field of Classification Search
USPC .................................. 341/118–120, 140–142
See application file for complete search history.

(56) References Cited

U.S. PATENT DOCUMENTS

| | | | |
|---|---|---|---|
| 8,760,335 B1 | 6/2014 | Kappes | |
| 9,030,341 B2 * | 5/2015 | Tan | H03M 1/1052 341/120 |
| 9,083,366 B1 | 7/2015 | Annampedu et al. | |
| 10,659,072 B1 * | 5/2020 | Lu | H03M 1/1215 |
| 10,680,630 B1 * | 6/2020 | David | H03M 1/0836 |
| 2003/0080885 A1 * | 5/2003 | Tamba | H03M 1/1038 341/120 |
| 2005/0270197 A1 * | 12/2005 | Smith | H03M 1/1028 341/120 |
| 2006/0061501 A1 * | 3/2006 | Sheng | H04N 5/44 341/155 |
| 2007/0120724 A1 * | 5/2007 | Hori | H03M 1/0626 341/156 |
| 2007/0171116 A1 | 7/2007 | Fuse et al. | |
| 2008/0024338 A1 * | 1/2008 | Huang | H03M 1/1028 341/120 |
| 2009/0131010 A1 * | 5/2009 | Oshima | H03M 1/122 455/334 |
| 2010/0156689 A1 | 6/2010 | Kuramochi et al. | |
| 2013/0106632 A1 * | 5/2013 | Petigny | H03M 1/1009 341/120 |
| 2013/0176154 A1 | 7/2013 | Bonaccio et al. | |
| 2014/0091955 A1 | 4/2014 | Cowley et al. | |
| 2015/0009059 A1 * | 1/2015 | Chen | H03M 1/187 341/155 |
| 2015/0061905 A1 | 3/2015 | Kappes | |
| 2016/0079994 A1 | 3/2016 | Lee et al. | |
| 2017/0117914 A1 | 4/2017 | Choi | |
| 2017/0134033 A1 * | 5/2017 | de Figueiredo | H03M 1/1038 |

OTHER PUBLICATIONS

Notice of Allowance from U.S. Appl. No. 16/221,394 notified Jan. 10, 2020, 9 pgs.

Mafi, Hamidreza et al., "Digital Blind Background Calibration of Imperfections in Time-Interleaved ADCs", IEEE Transactions on Circuits and Systems—I: Regular Papers, vol. 64, No. 6, Jun. 2017, 11 pgs.

* cited by examiner

TIME-INTERLEAVED ANALOG-TO-DIGITAL CONVERTER WITH CALIBRATION

CLAIM OF PRIORITY

This is a continuation of, and claims priority to, U.S. patent application Ser. No. 16/221,394, filed Dec. 14, 2018, and titled, "TIME-INTERLEAVE ANALOG-TO-DIGITAL CONVERTER WITH CALIBRATION," which is incorporated by reference in its entirety for all purposes.

BACKGROUND

Analog-to-Digital converter (ADC) is an essential building block in any of communication system to convert a received analog signal to a corresponding digital format for data processing or to recover the received digital signal. With the advance of communication systems in recent years, the speed requirement of data transition is getting into territory of tens of Giga bit per second (Gbps). For example, fourth generation serial-deserializers (Gen-4 Serdes) or 5G communication system process data in 10s of Gbps. This data speed increase directly results in the ADC operational speed increase to tens of Giga sample per second (Gsps). Time-interleave architecture becomes useful and popular among industry pioneers to fulfill the ADC speed requirement from high-speed communication systems since the operational speed of a standalone ADC can achieve merely up to 2 Gsps even with the development of circuit techniques and process technologies. However, due to the usage of multiple ADCs in a time-interleave architecture, the offset, gain, and timing skew mismatches from environment (e.g., temperature, voltage, drift etc.) or manufacturing variation between these ADCs can cause significant performance degradation.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
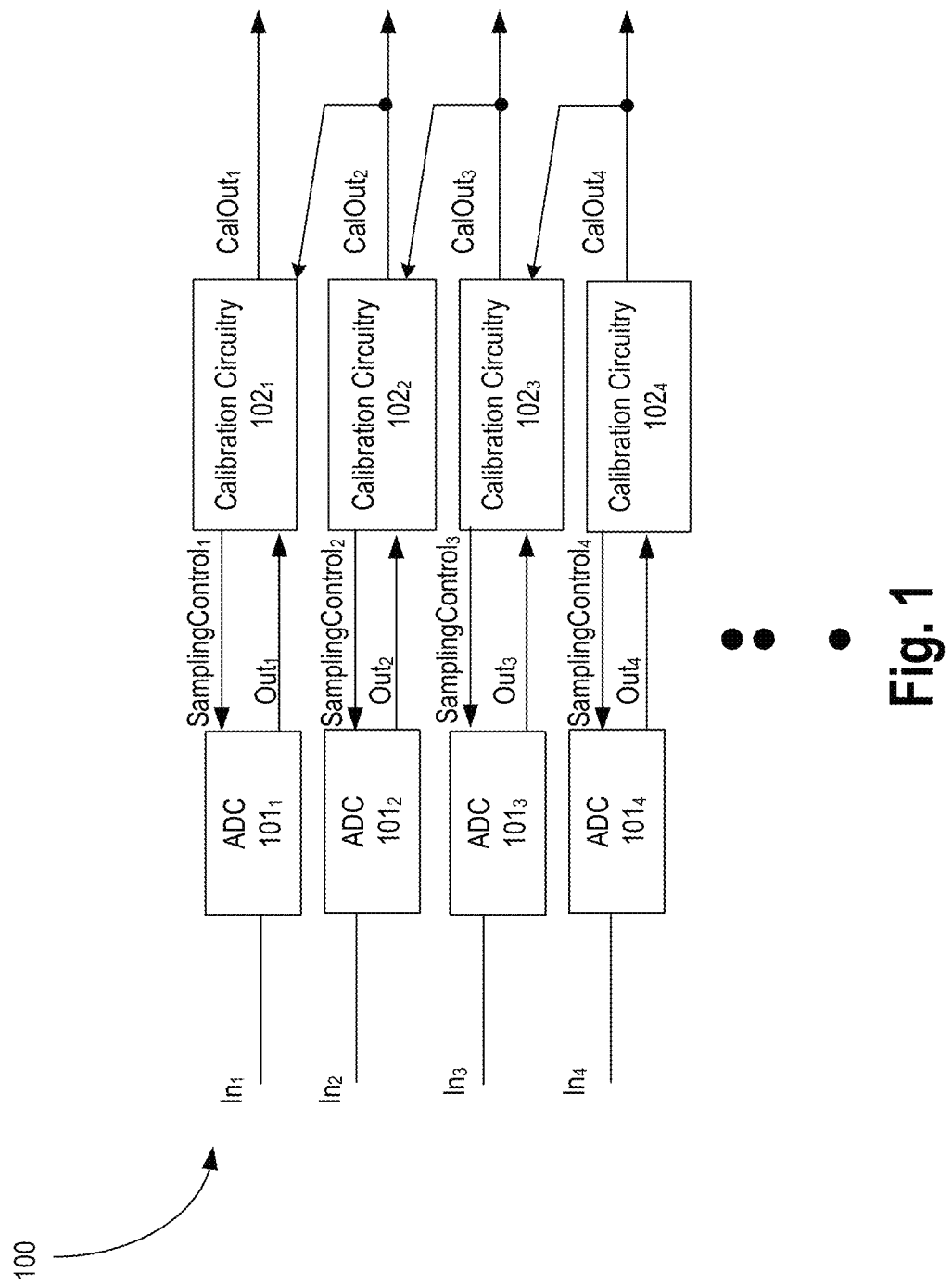
FIG. 1 illustrates a high-level architecture for calibrating performance parameters of one or more ADCs, in accordance with some embodiments.

Some embodiments describe an ADC architecture which continuously looks for the maximum (max) and minimum (min) values of individual ADC outputs and output differences between two neighboring ADCs in a time-interleave architecture. The max and min values and the relative output differences between neighboring ADCs provide insight into the mismatch of offset, gain, and timing skew between ADCs. This insight is then used to calibrate offset, gain, and timing skew between ADCs, in accordance with various embodiments.

There are many technical effect of the various embodiments. For example, the min-and-max based calibration for time-interleave ADC can calibrate offset, gain and timing skew mismatches in the background with a novel scheme and shared hardware. The system/product performance is therefore improved with minimal overhead on either silicon size, circuit performance (e.g., resolution and speed of ADC) or power consumption. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

Here the term "offset" generally refers to systematic or random offset error which represents deviation of an actual transfer function of the ADC from a perfect ADC transfer function. The offset may shift the whole transfer function to one direction at one constant value (positive or negative) at the point of zero to transition measured in a least significant bit. For example, when the transition from an ADC output value 0 to 1 does not occur at an input value of 0.5 LSB (or 1 to 2 at 1.5 LSB, 2 to 3 at 2.5 LSB, and so on), then there is an offset error. With positive offset errors, the output value is larger than 0 when the input voltage is less than 0.5 LSB from below. With negative offset errors, the output value stays at 0 when input is 0.5 LSB or larger, for example. In other words, if the actual transfer function lies below the ideal line, there is a negative offset and vice versa.

Here the term "gain error" generally refers to drift in the error of the ADC gain due to change in ambient temperature, supply voltage change and other factors. To distinguish from offset, the output shift from gain error is signal dependent.

Here the term "timing skew" generally refers to the sampling clock to be early or late from an expected timing, which results in the ADC sampling the wrong input.

Here, the term "analog signal" generally refers to any physical continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that elements of a figure having the same reference numbers (or names) as the elements of any other figure can operate or function in any manner similar to that described, but are not limited to such.

FIG. 1 illustrates a high-level architecture 100 for calibrating performance parameters of one or more ADCs, in accordance with some embodiments. Here, input $In_{1-4}$ is received by a plurality of ADCs $101_{1-4}$ coupled to corresponding calibration circuitries $102_{1-4}$ such that $In_1$ is received by ADC $101_1$, $In_2$ is received by ADC $101_2$, $In_3$ is received by ADC $101_3$, $In_4$ is received by ADC $101_4$, and so on. In some embodiments, $In_{1-4}$ is the same input. In that case, all ADCs receive the same input. Four ADCs and four calibration circuitries are showing as an example. Any number of ADCs and corresponding calibration circuitries may be used. The output of each ADC is received by a corresponding calibration circuitry. For example, $Out_1$ is received by Calibration Circuitry $102_1$, $Out_2$ is received by Calibration Circuitry $102_2$, $Out_3$ is received by Calibration Circuitry $102_3$, and $Out_4$ is received by Calibration Circuitry $102_4$, and so on. In this configuration, performance parameters (e.g., offset and gain mismatch) of an ADC can be calibrated. In some case, timing skew mismatch between ADCs is desired to be calibrated. For such relative timing skew mismatch calibration, in some embodiments, outputs of adjacent Calibration Circuitries are also received by a calibration circuitry. For example, $CalOut_2$ is received by Calibration Circuitry $102_1$, $CalOut_3$ is received by Calibration Circuitry $102_2$, $CalOut_4$ is received by Calibration Circuitry $102_3$ and so on. In some embodiments, the order of the outputs can be reversed. For example, $CalOut_1$ is received by Calibration Circuitry $102_2$, $CalOut_2$ is received by Calibration Circuitry $102_3$, $CalOut_3$ is received by Calibration Circuitry $102_4$, and so on.

In various embodiments, each calibration circuitry block provides a sampling control signal to the ADC. For example, Calibration Circuitry $102_1$ provides $SamplingControl_1$ to ADC $101_1$, Calibration Circuitry $102_2$ provides $SamplingControl_2$ to ADC $101_2$, Calibration Circuitry $102_3$ provides $SamplingControl_3$ to ADC $101_3$, Calibration Circuitry $102_4$ provides $SamplingControl_4$ to ADC $101_4$, and so on. These sampling control signals are used to minimize the timing skew mismatch. For example, $SamplingControl_1$ to ADC $101_1$ is used to adjust a delay of a sampling clock of ADC $101_1$.

The ADCs $101_{1-4}$ can be any type of ADC. ADCs are apparatuses that convert continuous physical quantities (e.g., voltages) to digital numbers that represent the amplitude of the physical quantities. Any suitable ADC may be used to implement ADCs $101_{1-4}$. For example, ADC $101_{1-4}$ is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs $101_{1-4}$ are considered to be flash ADCs.

In some embodiments, Calibration circuitry $102_{1-4}$ include circuitries to determine minimum and maximum values in the outputs of the ADCs. By continuously looking for the minimum and maximum values of individual ADC outputs (e.g., $Out_{1-4}$) and those of output difference between two neighbor ADCs (e.g., $101_1$ and $101_2$) in a time-interleave architecture, the mismatch of offset, gain, and timing skew between ADC branches are learned, respectively. This learning is then applied to calibrate the offset, gain, and timing skew between ADCs as described by the various embodiments.

Figure 2A:
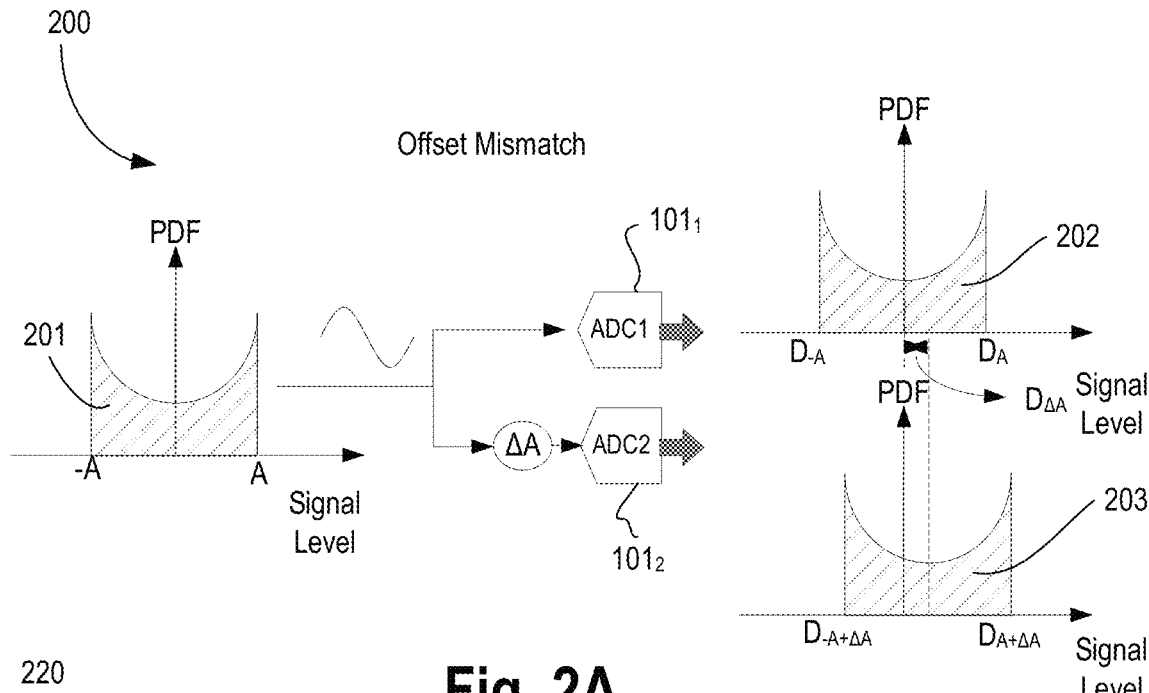
FIG. 2A illustrates a conceptual diagram of a probability density function (PDF) shifting due to offset in the ADC.

FIG. 2A illustrates a conceptual diagram 200 of a probability density function (PDF) shifting due to offset mismatch in the ADCs. When an analog signal is converted to a digital signal through an ADC, the center of the output signal PDF is directly impacted by the offset of the ADC. Conceptual diagram 200 illustrates the PDF 201 of the input analog signal which is received by ADC $101_1$. Here, ADC $101_2$ has offset (e.g., caused by random or systematic variations). The PDF 202 of the output of ADC $101_1$ shows the ideal PDF when there is no offset. PDF 203 of the output of ADC $101_2$ shows the shifted PDF caused by the offset in ADC $101_2$. Here, a sinusoidal input is used to illustrate the shifting of the PDFs. However, the shifting of PDF is seen with any type of input signal that has a defined PDF which is boundary limited. For example, signal in most of communication systems (cellular, WiFi, Serdes, etc.) exhibit a defined PDF which is boundary limited.

Figure 2B:
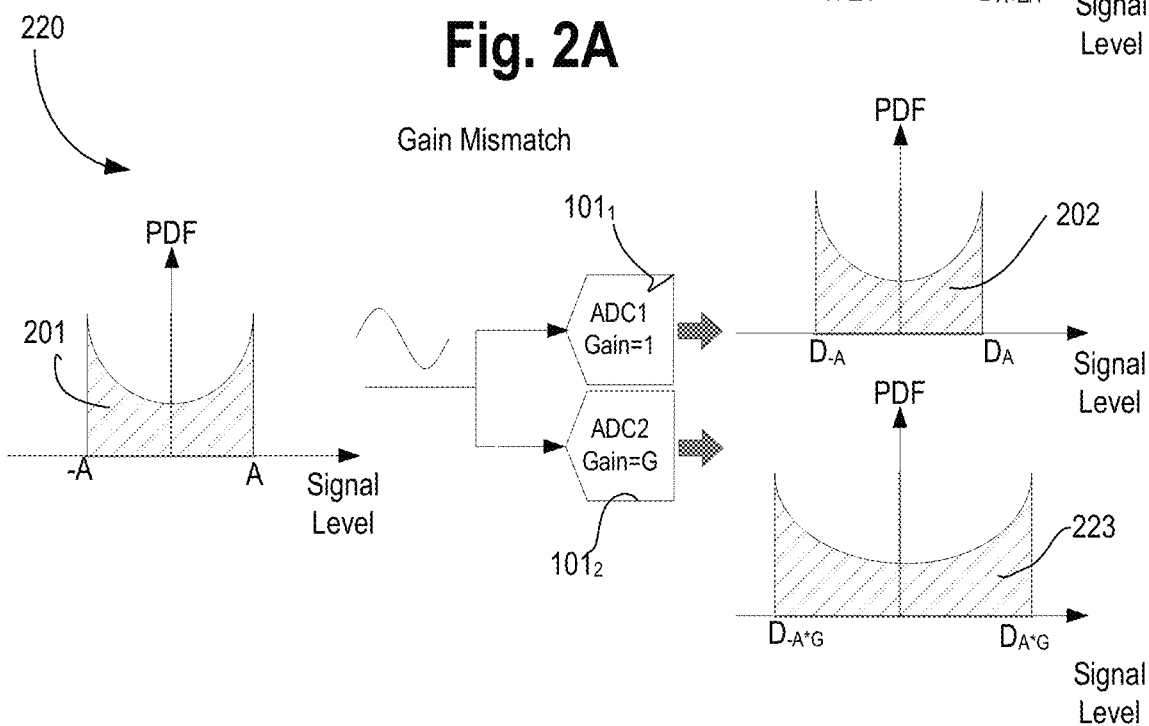
FIG. 2B illustrates a conceptual diagram of a PDF expanding due to gain mismatch in the ADC.

FIG. 2B illustrates conceptual diagram 220 of a PDF expanding due to gain mismatch in the ADCs. When an analog signal is converted to a digital signal through an ADC, the width of the output signal PDF is directly impacted by the offset of the ADC. Conceptual diagram 220 illustrates the PDF 201 of the input analog signal which is received by ADC $101_1$. Here, ADC $101_2$ has gain mismatch relative to gain of ADC $101_1$. The PDF 202 of the output of ADC $101_1$ shows the ideal PDF when gain is 1. PDF 223 of the output of ADC $101_2$ shows the expanded PDF caused by the gain of G in ADC $101_2$.

With reference to FIGS. 2A-B, the center of ADC output PDF is shifted when there is offset and the width of ADC output PDF is altered when the ADC gain is changed. By detecting the min value and max value of the ADC outputs in digital domain, the PDF boundary can be learned and so as the ADC offset (center) and gain (width) information based on the equation below.

$$PDF_{center_{ADC}} = \frac{max + mix}{2} \qquad \text{Eq. 1}$$

$$PDF_{width_{ADC}} = max - min \qquad \text{Eq. 2}$$

A simple signal post-processing in a digital signal processor (DSP) can then be applied to adjust the ADC output to equalize the PDF width from different ADC branches by multiplying a constant to the output (gain mismatch compensation) and equalize the PDF center by adding a constant to the output (offset mismatch compensation,) respectively.

Equations below show an example of signal post-processing on $ADC_2$ output to equalize ADC offset and gain mismatch, where $ADC_1$ is used as reference. Here, $\Delta OS$ and $\Delta GN$ are offset mismatch and gain mismatch from $ADC_2$, respectively.

$$\Delta OS = PDF_{center_{ADC1}} - PDF_{center_{ADC2}} \qquad \text{Eq. 3}$$

$$Output_{ADC2_{offset\ calibrated}} = (Output_{ADC2} + \Delta OS) \qquad \text{Eq. 4}$$

$$\Delta GN = \frac{PDF_{width_{ADC1}}}{PDF_{width_{ADC2}}} \qquad \text{Eq. 5}$$

$$Output_{ADC2_{gain\ calibrated}} = (Output_{ADC2} * \Delta GN) \qquad \text{Eq. 6}$$

In real application, since the ADC output is in the range from 0 to $2^M-1$, where M is the resolution bit of the ADC, the center of PDF is not zero. When gain mismatch alters the width of the PDF, it also changes the center of the distribution. So, to calibrate the offset and gain mismatches, the width of the ADC output PDF is aligned first with Eq.5 and Eq. 6 and then the center with Eq. 3 and Eq. 4, in accordance with some embodiments.

Once the mismatch of offset and gain between individual ADC branches are learned and calibrated, the calibrated outputs of neighbor ADCs are subtracted with each other ($output_{ADC1,calibrated} - output_{ADC2,calibrated}$ and $output_{ADC2,calibrated} - output_{ADC3,calibrated} \cdots$) and the same min and max circuitries can be applied to the subtraction results, in accordance with some embodiments.

Figure 3:
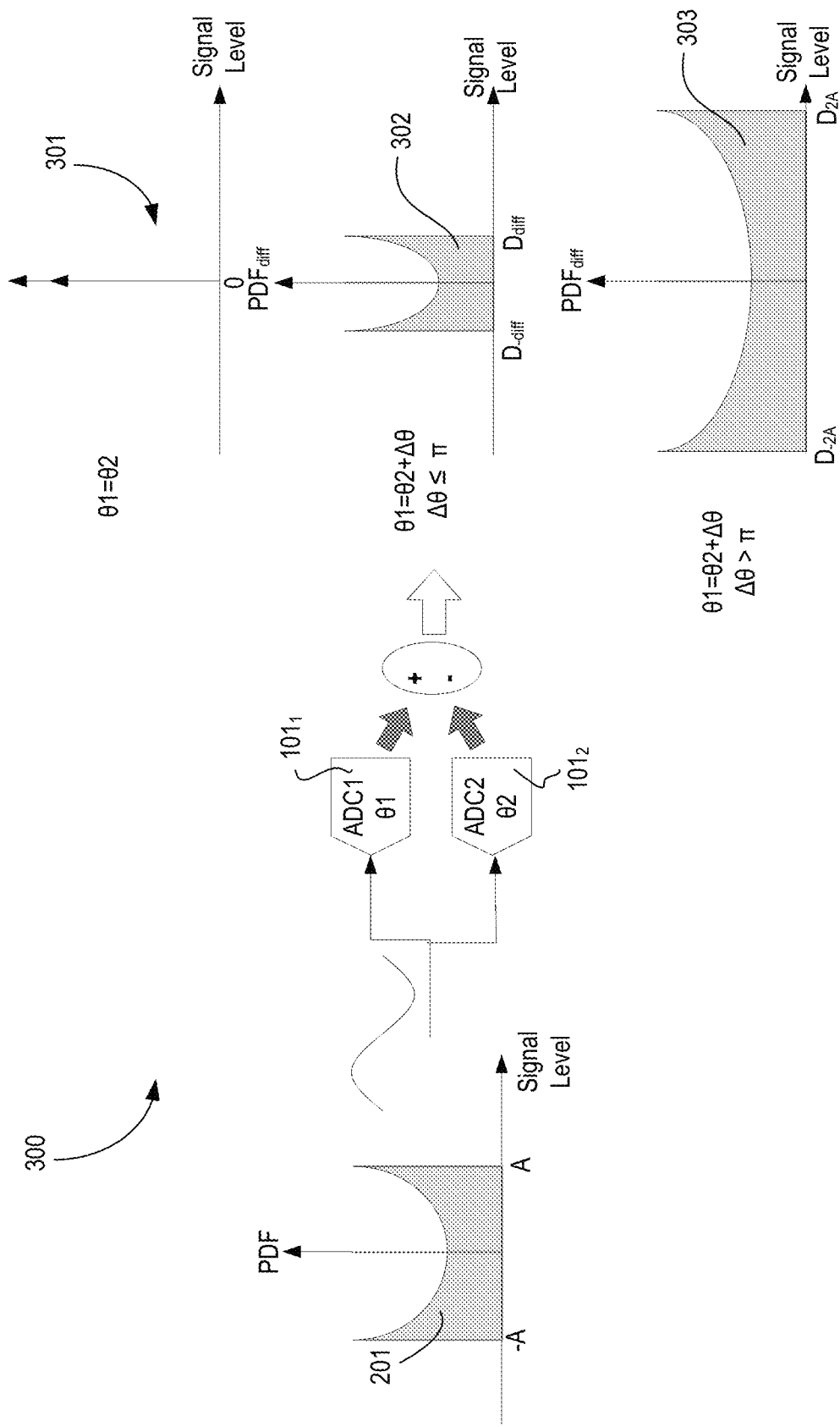
FIG. 3 illustrates a conceptual diagram of a PDF expanding or contracting due to difference in timing skew between ADCs.

FIG. 3 illustrates conceptual diagram 300 of a PDF expanding or contracting due to difference in timing skew between ADCs. Different from offset and gain mismatch characteristics, the timing skew mismatch between two ADCs shows linear dependency on the width of PDF of output difference of ADCs. When the operational phase of two ADCs $101_1$ and $101_2$ are aligned with each other, the output difference PDF is just a single tone at zero as illustrated by PDF 301. When the phase difference gets larger, the difference PDF width gets wider. For example, when the phase difference $\Delta\theta$ is less or equal to $2\pi$, or when the phase difference $\Delta\theta$ is greater than $2\pi$, then it means a certain width of the PDF should maintain when a timing phase difference between 2 ADCs is expected as illustrated by PDFs 302 and 303.

The minimum and maximum values acquired from the subtraction outcome can represent the width of the signal difference PDFs, i.e. the operational phase difference between ADC branches, depicted in Eq. 7.

$$PDF_{width_{ADC1-ADC2}} = max(output_{ADC1,calibrated} - output_{ADC2,calibrated}) - min(output_{ADC1,calibrated} - output_{ADC2,calibrated}) \qquad \text{Eq. 7}$$

The value is then compared with the reference ($PDF_{width\Delta ADC,sim}$), defined in design step and stored in memory. For example, the reference can be obtained through circuit model simulations and stored in a memory. The memory can be a fuse or a non-volatile memory, for instance. In some embodiments, the reference is programmable.

The timing skew mismatch ($\Delta TS$) can therefore be detected as:

$$\Delta TS \propto PDF_{width_{ADC1-ADC2}} - PDF_{width\Delta ADC,sim} \qquad \text{Eq. 8}$$

The linear dependency of subtraction PDF and timing skew mismatch is then used to adjust the sampling timing control of each ADC branch in either analog domain (by adjusting the ADC sampling timing) or in digital domain (by DSP) with simple algorithm (either successive approximation or least mean square), in accordance with some embodiments.

Figure 4:
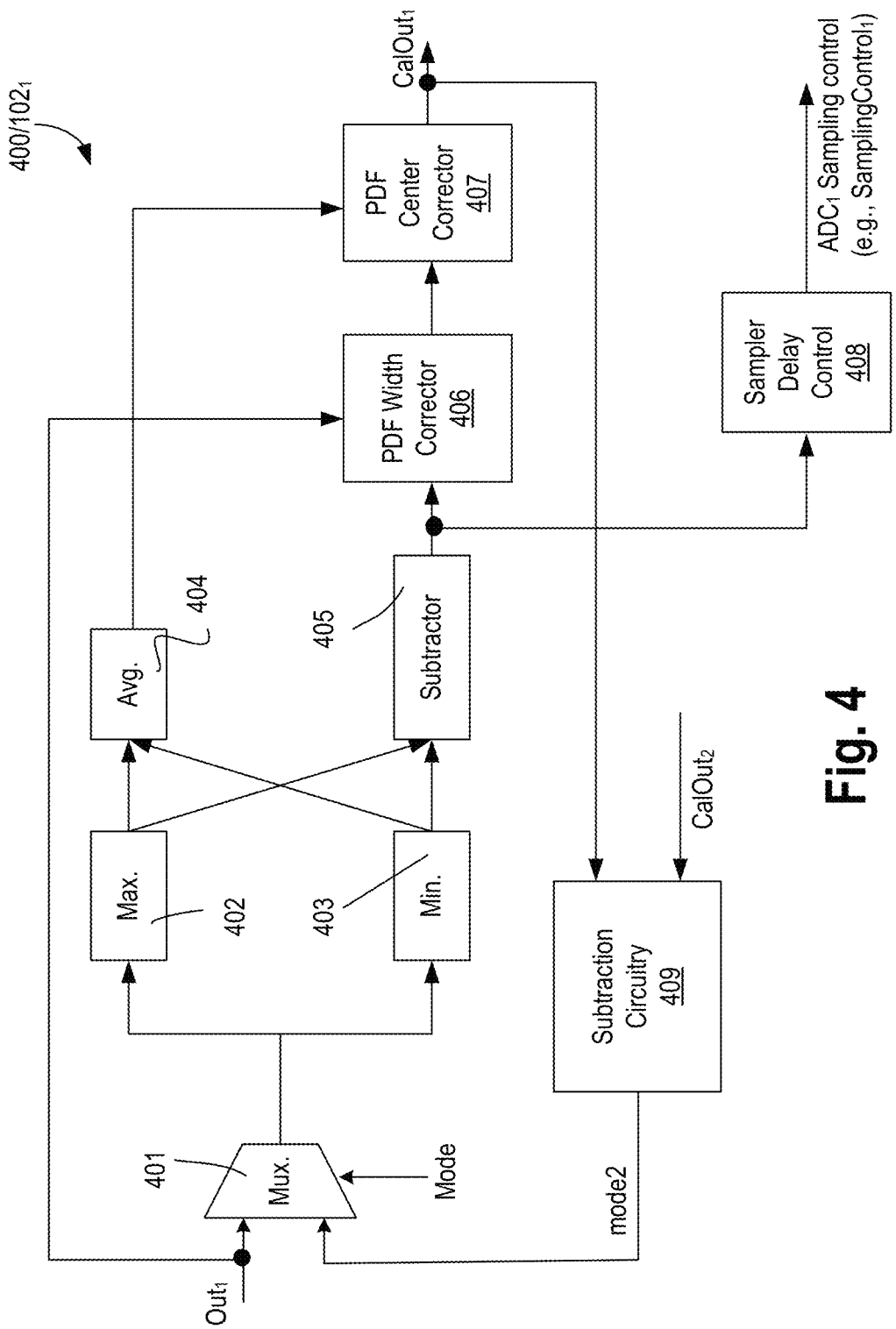
FIG. 4 illustrates a calibration circuit architecture for calibrating performance parameters of one or more ADCs, in accordance with some embodiments.

FIG. 4 illustrates a calibration circuit architecture 400 (e.g., $102_1$) for calibrating performance parameters of one or more ADCs, in accordance with some embodiments. In some embodiments, architecture 400 comprises multiplexer

401, circuitry 402 to determine a maximum value; circuitry 403 to determine a minimum value; circuitry 404 to determine an average of the minimum and maximum values, subtraction circuitry 405 to compute a difference of the maximum and minimum values, circuitry 406 to correct gain mismatch, circuitry 407 to correct offset mismatch, circuitry 408 to compare the difference with a threshold value, and circuitry 409 to determine difference between neighboring calibration outputs. In various embodiments, multiplexer (mux) 401 can selectively provide one of output of an ADC (e.g., $Out_1$) or mode2 (e.g., output of circuitry 409) as output. As such, the mux 401 can operate in two different modes. In the first mode, gain and offset mismatch calibration is performed. In this mode Out1 is selected and provided to circuitries 402 and 403 to determine the maximum and minimum values of the output of multiplexer 401. In the second mode, timing skew calibration is performed, in which mode2 is selected as output of mux 401.

In some embodiments, memory (e.g., non-volatile memory or regular volatile memory) is used to store the $\Delta OS$ and $\Delta GN$ from circuitries 404 and 405. The corrected output (e.g., $CalOut_2$) from neighbor ADC (e.g., $101_2$) is received by circuitry 409 to perform extraction of difference PDF for timing skew detection. In this embodiments, max 402, min 403, and subtraction 405 circuitries are reused for timing skew detection. In some embodiment, the sampling delay control circuitry 408 takes the outcome of subtraction circuitry 405 and derives the proper sampling delay control to minimize the timing skew mismatch based on Eq. 8.

The max 402 and min 403 circuitries can be implemented using any suitable logic. For example, max 402 circuitry comprises a comparator that compares a previous digital value of mux 401 output (e.g., digital value of $Out_1$ or mode2) with the current digital value of mux 401 output, and stores the large of the two in memory. After processing the entire $Out_1$ data stream, the maximum value is determined. A similar circuitry can be used for calculating the minimum value.

In some embodiments, average circuitry 404 is implemented with an adder and a divider. The adder is used to add the outputs of circuitries 402 and 403, and the added sum is then divided by two to generate an average. In some embodiments, shifting the bits of the added sum to right by one can also achieve the division. In some embodiments, the divider is implemented as a counter. In some embodiments, subtraction circuitries 405 and 409 are implemented as a typical adder or subtraction logic.

In some embodiments, logic 406 implements equations 5 and 6 while logic 407 implements equations 3 and 4. The output of circuitry 406 is a modified digital representation of the analog signal to $ADC_1$. For example, the output of circuitry 406 is a modified version of $Out_1$ in that the gain mismatch is corrected in the modified digital representation. This modified digital representation is a first modified digital representation. The first modified digital representation is then used by circuitry 407 to calibrate the offset from that digital representation. The output of circuitry 407 provides a second modified digital representation $CalOut_1$ of the analog signal $In_1$, where $CalOut_1$ has calibrated offset mismatch and calibrated gain mismatch. $CalOut_1$ is then received by circuitry 409 to start the process of calibrating the timing skew. Circuitry 409 subtracts two calibrations outputs $CalOut_1$ and $CalOut_2$, where $CalOut_2$ is a digital data with calibrated offset mismatch and calibrated gain mismatch for a neighboring ADC, $ADC_2$. To calibrate for timing skew, mode select signal causes Mux 401 to select output of circuitry 409 as output of Mux 401. Minimum and Maximum values for mode2 data are then determined along with the subtraction (form circuit 405).

In some embodiments, circuitry 408 comprises a comparator that compares the output of circuitry 405 with a threshold or target value. The target value may be defined during a design phase. For example, a designer may know what clock phase difference is acceptable and uses that as the target value. In some embodiments, the target value is programmable by modifying a value of a register. The output of circuitry 408 is used to adjust delay of a sampling clock of $ADC_1$ $101_1$ or ADC2 $101_2$. In one example, when $ADC_2$ is a reference and the phase difference between the phases of the sampling clocks of $ADC_1$ $101_1$ or ADC2 $101_2$ is above the target value, then it may be the case that sampling clock of ADC1 sampled its data too early resulting in timing skew mismatch between the two ADCs. In this example, the phase of the sampling clock to $ADC_1$ can be pushed out or delayed to calibrate the timing mismatch.

Figure 5:
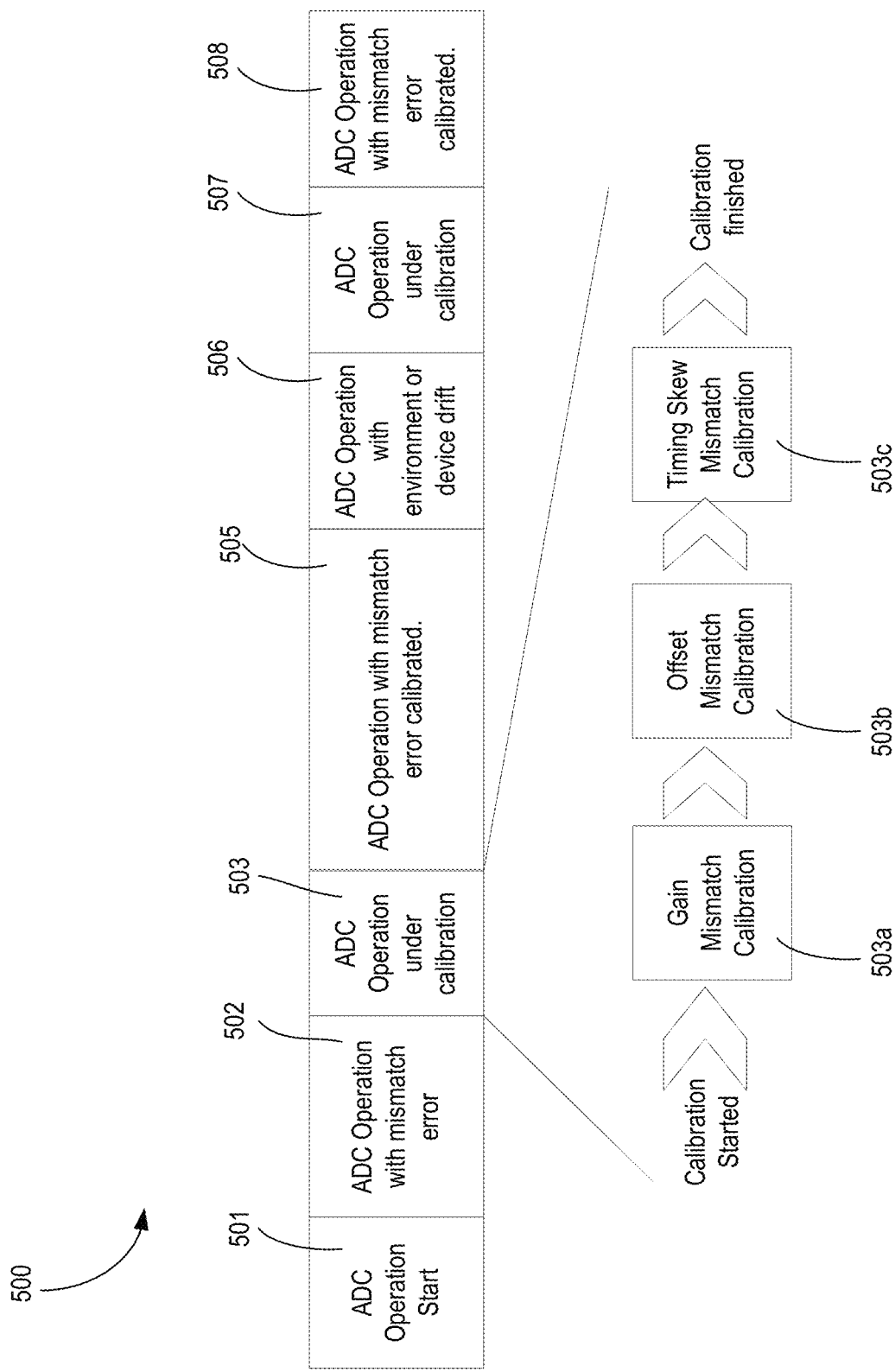
FIG. 5 illustrates an operational sequence for calibrating the performance parameters, in accordance with some embodiments.

FIG. 5 illustrates an operational sequence 500 for calibrating the performance parameters, in accordance with some embodiments. Sequence 500 begins at block 501 with the ADC operation where input analog signal is converted into a corresponding digital signal. At block 502, a determination is made about performance mismatch of the ADC. For example, $ADC_1$ has an offset mismatch relative to $ADC_2$, $ADC_1$ has a gain mismatch relative to $ADC_2$, and/or $ADC_1$ has a timing skew relative to $ADC_2$. If there is any performance mismatch determined by block 502, the process of calibration for the ADC begins at block 503. An expanded operation of block 503 is illustrated by blocks 503a, 503b, and 503c. At block 503a, gain mismatch is calibrated by circuitry 406. Followed by gain mismatch calibration, offset mismatch calibration is done by circuitry 407 at block 503b. In some embodiments, when offset mismatch calibration is performed first, then it may need to be performed again after gain mismatch calibration because the gain mismatch calibration may introduce an offset mismatch. After offset mismatch calibration, timing skew mismatch calibration is performed at block 503c. Calibration is then considered complete, and ADC operates with calibration and provides outputs which are more accurate than before the calibration.

At block 505 a determination is made that mismatches in the performance parameters are calibrated. Additional mismatches may be induced due to the environment or device drift during operation. In that case, another round of calibration can be kick started. The additional round of calibration is shown by blocks 506, 507 and 508. In some embodiments, the calibration process can be performed in the background without stopping the operation of the ADCs. In some embodiments, the calibration process can begin upon request. For example, the operating system (OS) can decide when to begin the calibration process. In some embodiments, the calibration process is done after a predetermined time (e.g., once a month). In some embodiments, the calibration process can be triggered when needed or is always on.

Figures 6A, 6B:
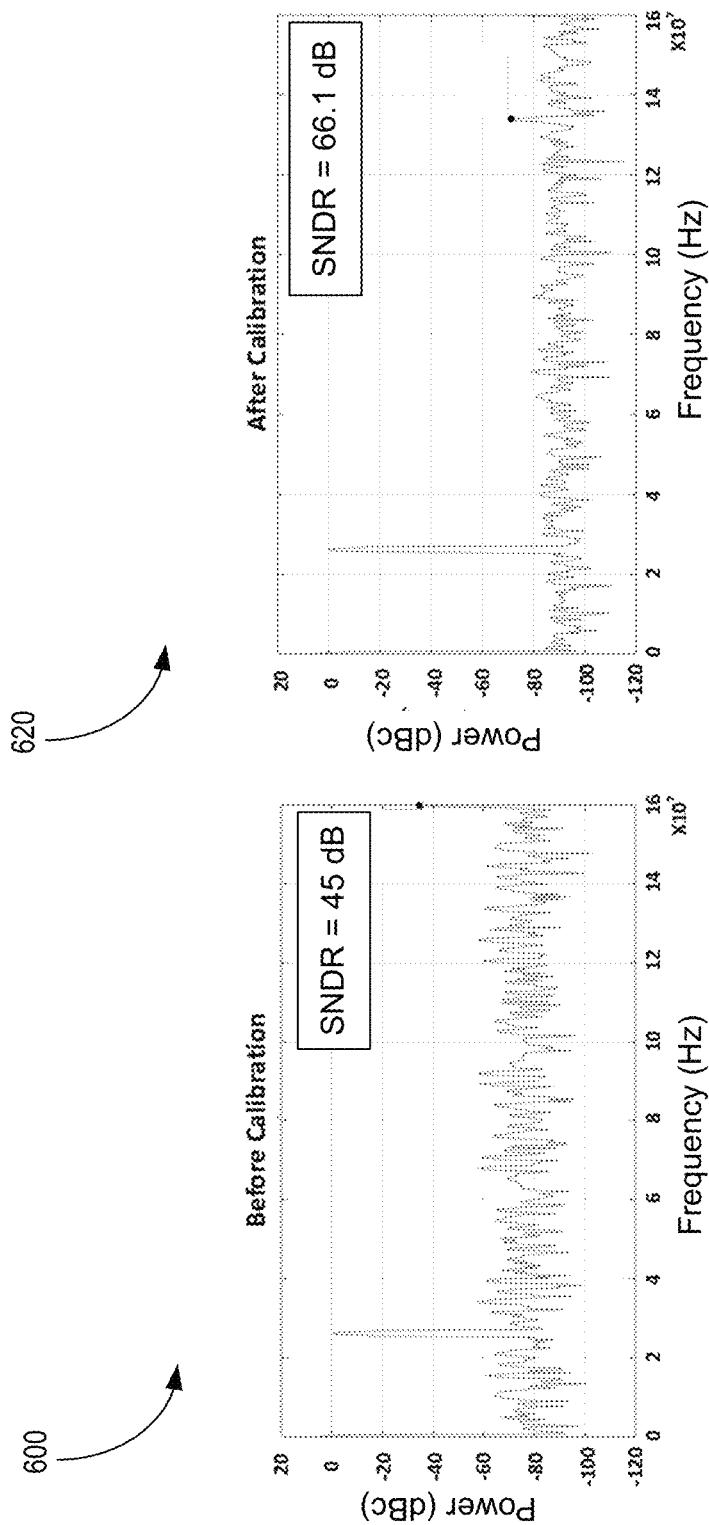
FIGS. 6A-B illustrates plots showing resolution of an ADC before and after calibration, in accordance with some embodiments.

FIGS. 6A-B illustrate plots 600 and 620 showing resolution of an ADC before and after calibration, respectively, in accordance with some embodiments. Plot 620 shows the effectiveness of the mismatch calibration on gain and offset mismatch correction in simulations. Here, with 10% gain mismatch and 20 mV offset mismatch from $ADC_2$ branch in 11-bit 2-stage time-interleaved ADC with 320 MSPS (sampling rate measured in samples per second), SNDR (signal-to-noise and distortion ratio) is improved from 45 dB to 66.1 dB after using the calibration scheme of various embodiments. As such, plot 620 shows better resolution with calibration compared to the ADC resolution without calibration.

Figure 7:
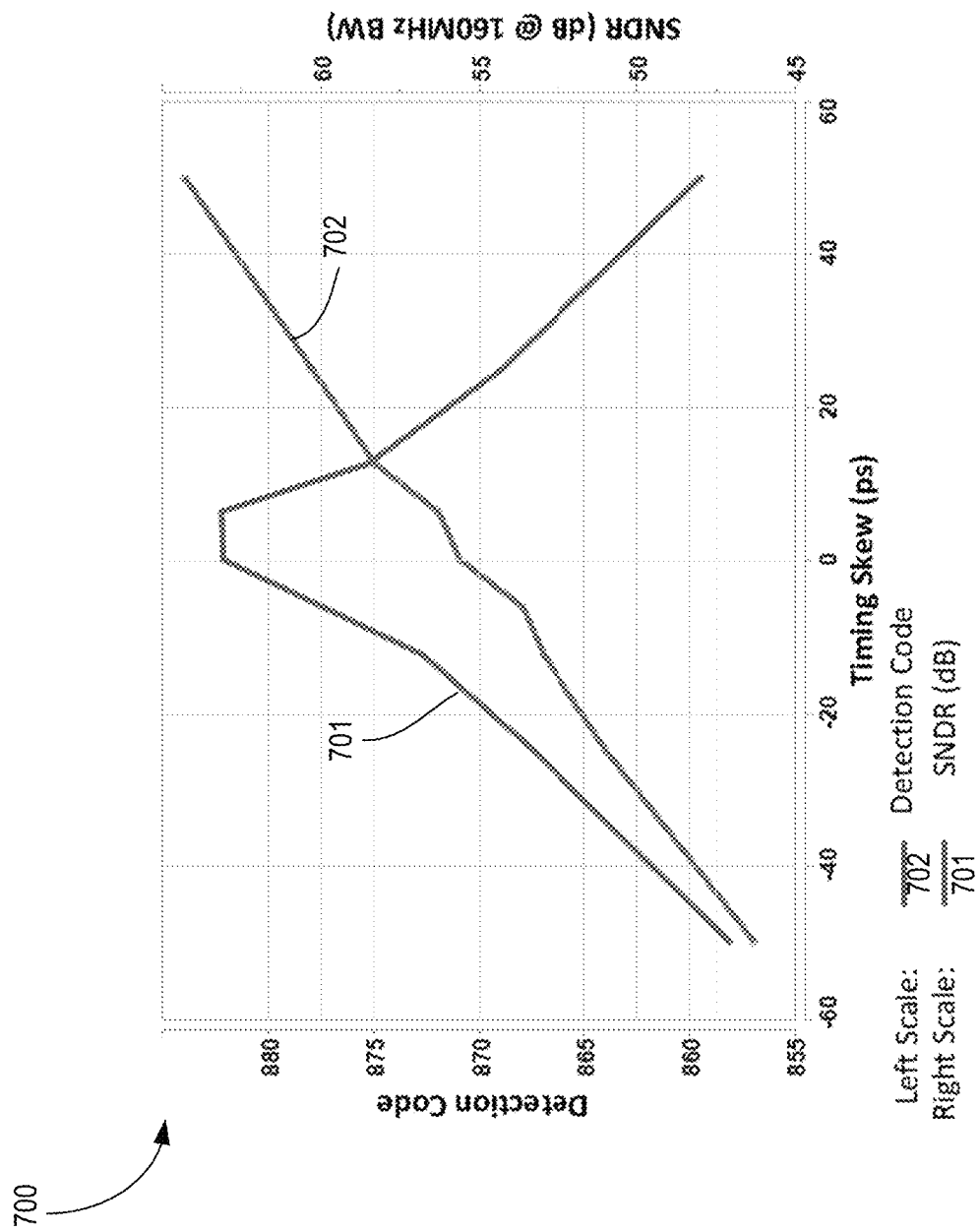
FIG. 7 illustrates a plot showing timing skew mismatch detection code, in accordance with some embodiments.

FIG. 7 illustrates plot 700 showing timing skew mismatch detection code, in accordance with some embodiments. Plot 700 shows two waveforms 701 and 702. Plot 700 depicts the linear dependency of timing skew mismatch on width of difference PDF in simulations with the same ADC of FIG. 6A. By sweeping the timing skew difference between two ADC branches from −50 ps to 50 ps, the detection code based on Eq. 7 shows linear trend 702, where the small notches around center are due to the timing resolution of simulations. Here, the best performance for the ADC (in view of timing skew mismatch) is achieved at the peak of waveform 701 where phase error is close to zero. The linear trend shown by waveform 702 allows for timing skew prediction. This plot demonstrates the capability of the calibration embodiments to detect the timing skew mismatch. In some embodiments, the compensation can be easily achieved with either successive approximation or LMS (least mean square) algorithm logics.

Figure 8:
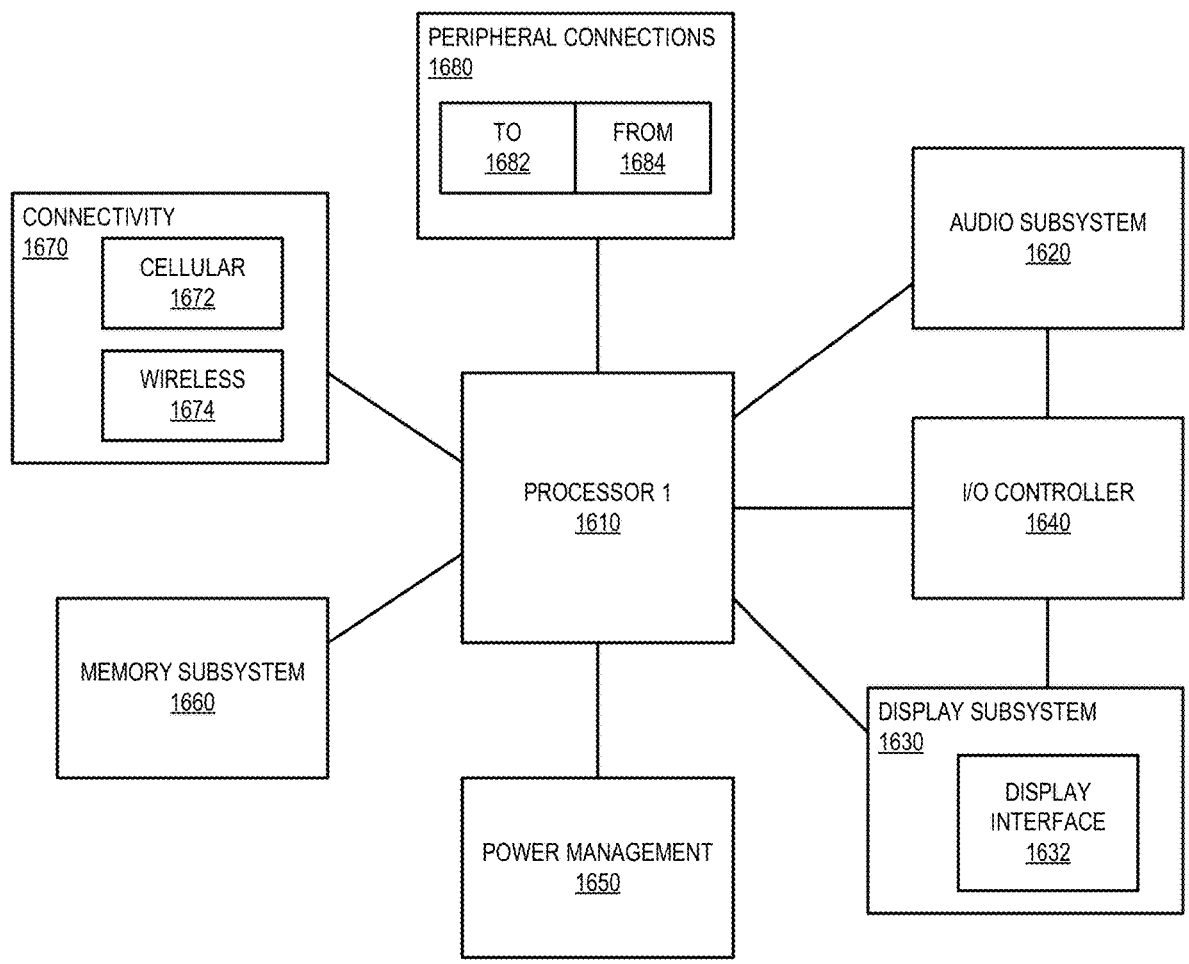
FIG. 8 illustrates a smart device or a computer system or a SoC (System-on-Chip) having an apparatus for calibrating performance parameters of one or more ADCs, according to some embodiments of the disclosure.

FIG. 8 illustrates a smart device or a computer system or a SoC (System-on-Chip) having an apparatus for calibrating performance parameters of one or more ADCs, according to some embodiments of the disclosure. The block diagram is, for example, of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having the apparatus for calibrating performance parameters of one or more ADCs, according to some embodiments discussed. Other blocks of the computing device 1600 may also include an apparatus for calibrating performance parameters of one or more ADCs, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or any other processor in the SOC) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments are here provided as examples. Each example here can include features of other examples in any suitable combination. The examples include:

Example 1

An apparatus comprising: an analog-to-digital converter (ADC) having an input to receive an analog signal and an output to provide a digital representation of the analog signal; a multiplexer coupled to the output of the ADC, wherein the multiplexer is to select between a first and second calibration mode; a first circuitry coupled to an output of the multiplexer, wherein the first circuitry is to determine a maximum value of the output of the multiplexer; and a second circuitry coupled to an output of the multiplexer, wherein the second circuitry is to determine a minimum value of the output of the multiplexer.

Example 2

The apparatus of example 1 comprises a third circuitry to receive the maximum and minimum values, wherein the third circuitry is to determine an average of the maximum and minimum values.

Example 3

The apparatus of example 2 comprises a fourth circuitry to receive the maximum and minimum values, wherein the fourth circuitry is to determine a difference between the maximum and minimum values.

Example 4

The apparatus of example 3 comprises a fifth circuitry to apply the difference to calibrate gain of the ADC, wherein the fifth circuitry is to output a modified digital representation of the analog signal.

Example 5

The apparatus of example 4, wherein the modified digital representation is a first modified digital representation, wherein the apparatus comprises a sixth circuitry to receive the first modified digital representation of the analog signal, and to apply the average to calibrate an offset of the ADC and to generate a second modified digital representation of the analog signal with calibrated offset.

Example 6

The apparatus of example 5, wherein the ADC is a first ADC, wherein the apparatus comprises a seventh circuitry to subtract the second modified digital representation from a third modified digital representation to generate a subtracted output, wherein the third modified digital representation has calibrated gain and offset associated with a second ADC, and wherein the subtracted output is received as input to the multiplexer.

Example, 7

The apparatus of example 7, wherein the multiplexer is to select the output of the ADC and to provide it as the output of the multiplexer in the first calibration mode, and wherein the multiplexer is to select the subtracted output as the output of the multiplexer in the second calibration mode.

Example 8

The apparatus of example 3 comprises an eighth circuitry to receive the difference and to compare the difference with a threshold, and to adjust a delay of a sampling clock to the ADC according to a result of the comparison.

Example 9

An apparatus comprising: an analog-to-digital converter (ADC) having an input to receive an analog signal and an output to provide a digital representation of the analog signal; and a calibration circuitry coupled to the output of the ADC, wherein the calibration circuitry is to identify a maximum value and a minimum value of the output of the ADC, and is to calibrate one or more performance parameters of the ADC according to the maximum and minimum values.

Example 10

The apparatus of example 9, wherein the ADC is a first ADC, and wherein the performance parameters include: gain of the ADC, offset of the ADC, and timing skew between the first ADC and a second ADC.

Example 11

The apparatus of example 9, wherein the calibration circuitry includes: a multiplexer coupled to the output of the ADC, wherein the multiplexer is to select between a first and second calibration modes; a first circuitry coupled to an output of the multiplexer, wherein in the first circuitry is to determine a maximum value of the output of the multiplexer; and a second circuitry coupled to an output of the multiplexer, wherein in the second circuitry is to determine a minimum value of the output of the multiplexer.

Example 12

The apparatus of example 11 comprises: a third circuitry to receive the maximum and minimum values, wherein the third circuitry is to determine an average of the maximum and minimum values; and a fourth circuitry to receive the maximum and minimum values, wherein the fourth circuitry is to determine a difference between the maximum and minimum values.

Example 13

The apparatus of example 12 comprises a fifth circuitry to apply the difference to calibrate gain of the ADC, wherein the fifth circuitry is to output a modified digital representation of the analog signal.

Example 14

The apparatus of example 13, wherein the modified digital representation is a first modified digital representation, wherein the apparatus comprises a sixth circuitry to receive the first modified digital representation of the analog signal, and to apply the average to calibrate an offset of the ADC and to generate a second modified digital representation of the analog signal with calibrated offset.

Example 15

The apparatus of example 14, wherein the ADC is a first ADC, wherein the apparatus comprises a seventh circuitry to subtract the second modified digital representation from a third modified digital representation to generate a subtracted output, wherein the third modified digital representation has calibrated gain and offset associated with a second ADC, and wherein the subtracted output is received as input to the multiplexer.

Example 16

The apparatus of example 12, wherein the multiplexer is to select the output of the ADC and to provide it as the output of the multiplexer in the first calibration mode, and wherein the multiplexer is to select the subtracted output as the output of the multiplexer in the second calibration mode.

Example 17

The apparatus of example 12 comprises an eighth circuitry to receive the difference and to compare the difference with a threshold, and to adjust a delay of a sampling clock to the ADC according to a result of the comparison.

Example 18

A system comprising: a memory; a processor coupled to the memory, the processor including: a first analog-to-digital converter (ADC) and a second ADC; a first calibration circuitry coupled to an output of the first ADC; a second calibration circuitry coupled to the first calibration circuitry and to an output of the second ADC, wherein the first or second calibration circuitries is to identify a maximum value and a minimum value of the output of the first ADC, and is to calibrate one or more performance parameters of the first ADC according to the maximum and minimum values; and a wireless interface to allow the processor to communicate with another device.

Example 19

The system of example 19, wherein the performance parameters include: gain of the ADC, offset of the ADC, and timing skew between the first ADC and the second ADC.

Example 20

The system of example 19, wherein the first and second calibration circuitries are to operate in parallel to the operation of the first and second ADCs.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
an analog-to-digital converter (ADC) having a first input to receive an analog signal and an output to provide a digital representation of the analog signal; and
a calibration circuitry having an input coupled to an output of the ADC, wherein the calibration circuitry includes a multiplexer coupled to the output of the ADC, wherein the multiplexer is to select between a first calibration mode and second calibration mode wherein an output of the calibration circuitry is coupled to a second input of the ADC, and wherein the output of the calibration circuitry is to adjust a delay of a sampling clock to the ADC.

2. The apparatus of claim 1, wherein the calibration circuitry includes a first circuitry coupled to an output of the multiplexer, and wherein the first circuitry is to determine a maximum value of the output of the multiplexer.

3. The apparatus of claim 2, wherein the calibration circuitry includes a second circuitry coupled to an output of the multiplexer, and wherein the second circuitry is to determine a minimum value of the output of the multiplexer.

4. The apparatus of claim 3, wherein the calibration circuitry comprises a third circuitry to determine an average of the maximum and minimum values.

5. The apparatus of claim 4, wherein the calibration circuitry comprises a fourth circuitry to determine a difference between the maximum and minimum values.

6. The apparatus of claim 5, wherein the calibration circuitry comprises a fifth circuitry to apply the difference to calibrate gain of the ADC.

7. The apparatus of claim 6, wherein the fifth circuitry is to output a modified digital representation of the analog signal.

8. The apparatus of claim 7, wherein the modified digital representation is a first modified digital representation, and wherein the calibration circuitry comprises a sixth circuitry to receive the first modified digital representation of the analog signal, and to apply the average to calibrate an offset of the ADC and to generate a second modified digital representation of the analog signal with calibrated offset.

9. The apparatus of claim 8, wherein the ADC is a first ADC, wherein the apparatus comprises a seventh circuitry to subtract the second modified digital representation from a third modified digital representation to generate a subtracted output, wherein the third modified digital representation has calibrated gain and offset associated with a second ADC, and wherein the subtracted output is received as input to the multiplexer.

10. The apparatus of claim 9, wherein the multiplexer is to select the output of the ADC and to provide it as the output of the multiplexer in the first calibration mode, and wherein the multiplexer is to select the subtracted output as the output of the multiplexer in the second calibration mode.

11. The apparatus of claim 5, wherein the calibration circuitry comprises an eighth circuitry to receive the difference and to compare the difference with a threshold, and to adjust a delay of a sampling clock to the ADC, via the second input, according to a result of the comparison.

12. An apparatus comprising:
a first an analog-to-digital converter (ADC) having an input to receive a first analog signal and an output to provide a first digital representation of the first analog signal;
a second ADC having an input to receive a second analog signal and an output to provide a second digital representation of the second analog signal;
a first calibration circuitry; and
a second calibration circuitry, wherein the first calibration circuitry is to receive the first digital representation and an output of the second calibration circuitry, wherein the first calibration circuitry is to generate a first sampling control for the first ADC, wherein the second calibration circuitry is to receive the second digital representation and an output of a third calibration circuitry, and wherein the second calibration circuitry is to generate a second sampling control for the second ADC.

13. The apparatus of claim 12, wherein the first sampling control is to calibrate one or more performance parameters of the first ADC, and wherein the second sampling control is to calibrate one or more performance parameters of the second ADC.

14. The apparatus of claim 13, wherein the one or more performance parameters include: gain of the first or second ADC, offset of the first or second ADC, and timing skew between the first ADC and the second ADC.

15. The apparatus of claim 12, wherein the first or second calibration circuitries includes a first circuitry coupled to an output of a multiplexer, and wherein the first circuitry is to determine a maximum value of the output of the multiplexer.

16. The apparatus of claim 15, wherein the first or second calibration circuitries include a second circuitry coupled to an output of the multiplexer, and wherein the second circuitry is to determine a minimum value of the output of the multiplexer.

17. The apparatus of claim 12, wherein the first and second calibration circuitries are to operate in parallel to the operation of the first and second ADCs.

18. A system comprising:
a memory;
a processor coupled to the memory; and
a wireless interface communicatively coupled to the processor, wherein the processor includes:

an analog-to-digital converter (ADC) having a first input to receive an analog signal and an output to provide a digital representation of the analog signal; and a calibration circuitry having an input coupled to an output of the ADC, wherein the calibration circuitry includes a multiplexer coupled to the output of the ADC, wherein the multiplexer is to select between a first calibration mode and second calibration mode, wherein an output of the calibration circuitry is coupled to a second input of the ADC, and wherein the output of the calibration circuitry is to adjust a delay of a sampling clock to the ADC.

19. The system of claim 18, wherein the calibration circuitry includes a first circuitry coupled to an output of the multiplexer, and wherein the first circuitry is to determine a maximum value of the output of the multiplexer.

20. The system of claim 19, wherein the calibration circuitry includes a second circuitry coupled to an output of the multiplexer, and wherein the second circuitry is to determine a minimum value of the output of the multiplexer.

* * * * *